United States Patent
Zhan et al.

(10) Patent No.: US 10,123,280 B2
(45) Date of Patent: Nov. 6, 2018

(54) DYNAMIC POWER CONTROL IN A TRANSMISSION LINK

(71) Applicant: Huawei Technologies Co., Ltd., Shenzhen, Guangdong (CN)

(72) Inventors: Peng Zhan, Nanjing (CN); Huaping Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 394 days.

(21) Appl. No.: 14/476,098

(22) Filed: Sep. 3, 2014

(65) Prior Publication Data
US 2015/0067380 A1 Mar. 5, 2015

(30) Foreign Application Priority Data
Sep. 3, 2013 (CN) .......................... 2013 1 0395475

(51) Int. Cl.
*H04W 52/24* (2009.01)
*H04W 52/28* (2009.01)
(Continued)

(52) U.S. Cl.
CPC ..... *H04W 52/241* (2013.01); *H03M 13/1102* (2013.01); *H03M 13/1128* (2013.01);
(Continued)

(58) Field of Classification Search
None
See application file for complete search history.

(56) References Cited

U.S. PATENT DOCUMENTS

2003/0194979 A1* 10/2003 Richards .............. H04B 1/7163
  455/216
2008/0242339 A1* 10/2008 Anderson .......... H04B 7/18543
  455/522
(Continued)

FOREIGN PATENT DOCUMENTS

| CN | 101043233 A | 9/2007 |
| CN | 101179308 A | 5/2008 |
| CN | 101615956 A | 12/2009 |

OTHER PUBLICATIONS

Bulakci, Omer. "Towards 100 Gbps Ethernet: Development of Ethernet / Physical Layer Aspects." Seminar on Topics in Communications Engineering, Technische University at Munchen. Jan. 11, 2008.*

(Continued)

*Primary Examiner* — Kim Huynh
*Assistant Examiner* — Joshua Neveln
(74) *Attorney, Agent, or Firm* — Leydig, Voit & Mayer, Ltd.

(57) ABSTRACT

The application provides a power control method and apparatus. The power control method includes: obtaining, by a transmit end of a link, bit error rate information of a receive end of the link; and if the bit error rate information does not meet a predetermined condition, adjusting a transmit power class value of the transmit end. According to the power control method and apparatus of the application, the transmit power class value of the transmit end of the link can be dynamically adjusted according to a change of a system or an external environment, thereby improving interference immunity of the link and ensuring stability and reliability of data transmission.

20 Claims, 4 Drawing Sheets

(51) Int. Cl.
    *H04W 52/20*     (2009.01)
    *H03M 13/11*     (2006.01)
    *H03M 13/35*     (2006.01)
    *H03M 13/09*     (2006.01)
    *H03M 13/29*     (2006.01)

(52) U.S. Cl.
    CPC ......... *H03M 13/353* (2013.01); *H04W 52/20* (2013.01); *H04W 52/288* (2013.01); *H03M 13/09* (2013.01); *H03M 13/2906* (2013.01)

(56) References Cited

U.S. PATENT DOCUMENTS

| | | | |
|---|---|---|---|
| 2010/0179702 A1* | 7/2010 | Guo | H04W 52/325 700/286 |
| 2011/0275404 A1 | 11/2011 | Ding et al. | |
| 2012/0240004 A1* | 9/2012 | Diab | H03M 13/1102 714/752 |
| 2013/0016684 A1 | 1/2013 | Attar et al. | |

OTHER PUBLICATIONS

"IEEE Standard for Information technology—Telecommunications and information exchange between systems—Local and metropolitan area networks-Special requirements; Part 3: Carrier Sense Multiple Access with Collision Detection (CSMA/CD) Access Method and Physical Layer Specifications; Amendment 1: Physical Layer and Management Parameters for 10 Gb/s Operation, Type 10GBASE-T," IEEE Std 802.3an-2006, pp. i-167, Institute of Electrical and Electronics Engineers, New York, New York (Sep. 1, 2006).

* cited by examiner

DYNAMIC POWER CONTROL IN A TRANSMISSION LINK

CROSS-REFERENCE TO RELATED APPLICATION

This application claims priority to Chinese Patent Application No. 201310395475.0, filed Sep. 3, 2013, which is hereby incorporated by reference in its entirety.

TECHNICAL FIELD

The present application relates to the field of communications technologies, and in particular, to a power control method and apparatus.

BACKGROUND

In a data center local area network, to achieve a high transmission rate, for example, 10 Gbps, and data transmission over a long distance, for example, more than 100 meters, a 10GBASE-T (10 Gigabit Ethernet over Twisted-pair Copper cable) and an optical interconnection network need to be used. Specifically, the 10GBASE-T is a physical layer standard for transmitting data over a Class E or a Class F cable at a rate of 10 Gbps, and can help achieve 100-meter transmission over the Class E or the Class F cable. An external environment may cause interference to a transmission link, and therefore interference immunity of the transmission link needs to be improved, to ensure stability and reliability of data transmission.

In the prior art, because a transmission distance and signal quality vary with cables of different specifications, such as copper cables and optical cables, cables of high shielding performance are used in long-distance data transmission, to improve interference immunity of a transmission link, which however, increases a network interconnection cost.

SUMMARY

In view of this, a technical problem to be resolved in the present application is how to improve interference immunity of a link.

To resolve the foregoing problem, in a first aspect, the present application provides a power control method, including: obtaining bit error rate information of a receive end of a link; adjusting a transmit power class value of a transmit end of the link if the bit error rate information does not meet a predetermined condition.

With reference to the first aspect, in a first possible implementation manner, after the adjusting a transmit power class value of a transmit end, the method further includes: obtaining a signal-to-noise ratio of the transmit end and a signal-to-noise ratio of the receive end; if the signal-to-noise ratio of the transmit end and the signal-to-noise ratio of the receive end remain unchanged or increase compared with those before the transmit power class value of the transmit end is adjusted, determining that power control is successful; and if the signal-to-noise ratio of the transmit end or the signal-to-noise ratio of the receive end decreases compared with that before the transmit power class value of the transmit end is adjusted, reversely adjusting the transmit power class value of the transmit end.

With reference to the first aspect, in a second possible implementation manner, the transmit end receives the bit error rate information and the signal-to-noise ratio that are based on channel encoding and sent by the receive end.

With reference to the second possible implementation manner of the first aspect, in a third possible implementation manner, the channel encoding is low-density parity-check (LDPC) encoding if the link is an Ethernet link in a 10 Gigabit Ethernet over twisted pair copper cable (10GBASE-T); the channel encoding is 64B/66B encoding if the link is an optical link in an optical communications network; and the channel encoding is orthogonal frequency division multiplexing encoding if the link is a radio link in a wireless local area network.

With reference to the second possible implementation manner of the first aspect, in a fourth possible implementation manner, the bit error rate information includes a bit error rate of the receive end, or a bit error rate of the receive end and bit error duration of the receive end, or a bit error rate of the receive end and the number of data packet retransmission times of the receive end, or a bit error rate of the receive end, bit error duration of the receive end, and the number of data packet retransmission times of the receive end.

To resolve the foregoing problem, according to a second aspect, the present invention provides a power control apparatus, including: an obtaining unit, configured to obtain bit error rate information of a receive end of a link; and a processing unit, connected to the obtaining unit and configured to adjust a transmit power class value of a transmit end of the link if the bit error rate information does not meet a predetermined condition.

With reference to the second aspect, in a first possible implementation manner, the obtaining unit is further configured to obtain a signal-to-noise ratio of the transmit end and a signal-to-noise ratio of the receive end after the transmit power class value of the transmit end is adjusted; and the processing unit is further configured to reversely adjust the transmit power class value of the transmit end if the signal-to-noise ratio of the transmit end or the signal-to-noise ratio of the receive end decreases compared with that before the transmit power class value of the transmit end is adjusted.

With reference to the first possible implementation manner of the second aspect, in a second possible implementation manner, the obtaining unit is further configured to receive the bit error rate information that is based on channel encoding and sent by the receive end, and receive the signal-to-noise ratio that is based on channel encoding and sent by the receive end.

Bit error rate information and/or a signal-to-noise ratio of a receive end of a link is obtained, and a transmit power class value of a transmit end of the link is adjusted accordingly. According to the power control method provided in the foregoing embodiments of the present invention, the transmit power class value of the transmit end of the link can be dynamically adjusted according to a change of an external environment, thereby improving interference immunity of the link and ensuring stability and reliability of data transmission.

Exemplary embodiments are described in detail in the following with reference to accompanying drawings to make other features and aspects of the present application clearer.

BRIEF DESCRIPTION OF DRAWINGS

Accompanying drawings included in the specification and constituting a part of the specification, together with the specification illustrate exemplary embodiments, features, and aspects of the present application, and are used for explaining principles of the present application.

DESCRIPTION OF EMBODIMENTS

Figure 1:
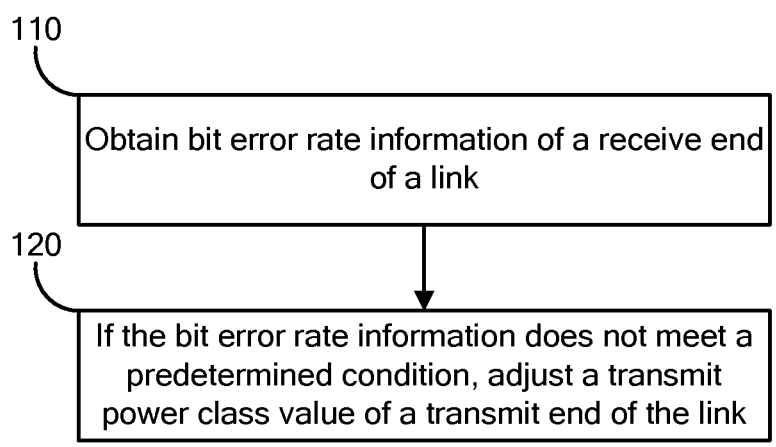
FIG. 1 is a flowchart of a power control method according to an embodiment of the present application.

The following describes various exemplary embodiments, features, and aspects of the present application with reference to the accompanying drawings. Same reference numerals in the accompanying drawings indicate components with a same or similar function. The accompanying drawings show each aspect of an embodiment, but the accompanying drawings do not need to be drawn to scale unless otherwise specified.

The special term "exemplary" herein means "being used as an example or an embodiment or being illustrative". Any embodiment described as "exemplary" herein is not necessarily to be interpreted as superior to or better than other embodiments.

In addition, in order to better describe the present invention, many specific details are provided in the following specific implementation manners. A person skilled in the art should understand that the present application can be still implemented without such details. In other embodiments, well-known methods, means, components, and circuits are not described in detail, to highlight the subject of the present application.

FIG. 1 is a flowchart of a power control method provided in an embodiment of the present application. As shown in FIG. 1, the power control method mainly includes:

110. Obtain bit error rate information of a receive end of a link.

120. If the bit error rate information does not meet a predetermined condition, adjust a transmit power class value of a transmit end of the link according to the bit error rate information.

In a 10GBASE-T scenario, the transmit end and the receive end may be 10GBASE-T switches or 10GBASE-T routers. In addition, in a wireless local area network, the transmit end and the receive end may be a wireless access point (AP) or a Wi-Fi terminal device. In an optical communications network, the transmit end and the receive end may be optical switches or optical routers.

The transmit power class value is related to a transmission distance range between the receive end and the transmit end. In the 10GBASE-T scenario, a class value may be set for transmit power of a PHY (Physical Layer) chip at the transmit end. Different transmit power class values may be set for the PHY chip at the transmit end according to different transmission distance ranges between the receive end and the transmit end. For example, the class value is 0-5, and one class value corresponds to specific transmit power. For example, when the transmission distance range is 0-100 meters, the transmit power class value of the PHY chip at the transmit end may be set to 2.

However, an external environment may cause interference to the link, and as a result, a bit error or packet loss occurs on the link, thereby reducing communication quality. Generally, the external environment also changes dynamically. Therefore, in the present application, by detecting the bit error rate information of the receive end, the transmit power class value of the PHY chip at the transmit end is dynamically adjusted, to resolve a problem that packet loss occurs due to cable aging or external environment interference to the link.

It should be noted that, the receive end and the transmit end are only relative in one data transmission. In multiple data transmissions, the receive end and the transmit end may be exchangeable. For example, if a device A sends data to a device B, the device A is the receive end and the device B is the transmit end; if the device B sends data to the device A, the device B is the receive end and the device A is the transmit end.

According to the obtained bit error rate information of the receive end of the link, the transmit power class value of the transmit end of the link is adjusted. According to the power control method provided in the foregoing embodiment of the present application, the transmit power class value of the transmit end of the link can be dynamically adjusted according to a change of a system or an external environment, thereby improving interference immunity of the link and ensuring stability and reliability of data transmission.

Figure 2:
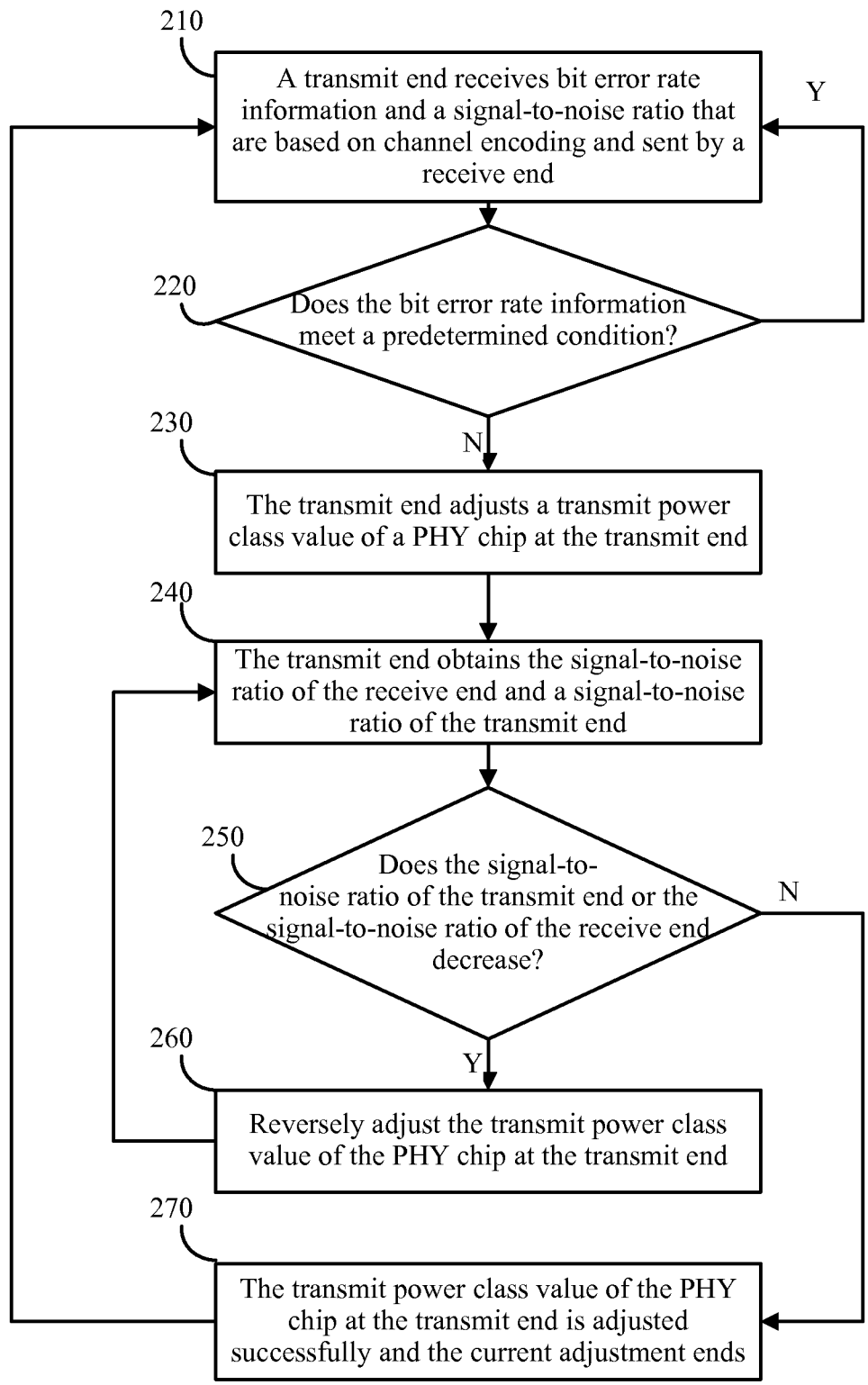
FIG. 2 is a flowchart of another power control method according to an embodiment of the present application.

On a basis of the power control method shown in FIG. 1 of the present application, and referring to FIG. 2, FIG. 2 is a flowchart of another power control method provided in an embodiment of the present application. The method includes:

210. A transmit end of a link receives bit error rate information and a signal-to-noise ratio that are based on channel encoding and sent by a receive end of the link.

The receive end may regularly send the bit error rate information and signal-to-noise ratio to the transmit end.

Step 210 may specifically include any one of the following scenarios:

Scenario 1. In a 10GBASE-T scenario, the transmit end receives bit error rate information and a signal-to-noise ratio that are based on LDPC encoding and sent by the receive end.

Specifically, if the bit error rate information and/or the signal-to-noise ratio is transmitted by using the TCP/IP protocol between the receive end and the transmit end, valid bandwidth of a transmission link may be occupied, and CPUs and adapter chips at the receive end and the transmit end need to be involved in this process. In this case, the process is complex and efficiency is low. In this embodiment, idle resources of LDPC encoding existing in a PHY chip at the receive end and in a PHY chip at the transmit end may be used to transmit the bit error rate information. In this manner, the valid bandwidth of the transmission link is not occupied. In addition, LDPC encoding has a strong error-correction capability and can increase an encoding gain. Therefore, LDPC encoding is especially suitable for 100-meter transmission over the 10 Gbps Ethernet. In addition, an actual cabling requirement for 10GBASE-T is lowered and no additional network interconnection cost is caused.

Scenario 2. In an optical communications network, the transmit end receives bit error rate information and a signal-to-noise ratio that are based on 64B/66B encoding and sent by the receive end.

Specifically, in the optical communications network, the signal-to-noise ratio and the bit error rate information can be transmitted between an OLT and an ONU of optical switches or optical routers in a manner of 64B/66B encoding, and then transmit power of the optical switches or the optical routers is adjusted in real time according to the bit error rate information and the signal-to-noise ratio.

Scenario 3. In a wireless local area network, the transmit end receives bit error rate information and a signal-to-noise ratio that are based on orthogonal frequency division multiplexing encoding and sent by the receive end.

Specifically, in the wireless local area network, for example, a Wi-Fi network, the signal-to-noise ratio and the bit error rate information can be transmitted between a wireless access point and a terminal in a manner of orthogonal frequency division multiplexing encoding, and then transmit power of the AP and the terminal is adjusted in real time according to the bit error rate information and the signal-to-noise ratio.

In a possible implementation manner of the foregoing power control method, step 120 may specifically include:

220. The transmit end determines whether the bit error rate information of the receive end meets a predetermined condition.

The bit error rate information may include a bit error rate, or may include bit error duration and/or the number of data packet retransmission times.

Specifically, the predetermined condition may be that the bit error rate is not greater than a preset bit error rate threshold; if the bit error rate of the receive end is greater than the preset bit error rate threshold, for example, $10^{-10}$, it indicates that the bit error rate information of the receive end does not meet the predetermined condition. The predetermined condition may also be that the bit error rate is not greater than the preset bit error rate threshold and the bit error duration is not greater than a preset bit error duration threshold and/or the number of data packet retransmission times is not greater than a preset threshold for the number of retransmission times. For example, if the bit error rate of the receive end is greater than the preset bit error rate threshold, or the bit error duration is greater than the preset bit error duration threshold, it indicates that the bit error rate information of the receive end does not meet the predetermined condition. Other circumstances can be obtained by analogy and details are not described again.

If it is determined that the bit error rate information meets the predetermined condition, a transmit power class value of the PHY chip at the transmit end is not adjusted; then steps 210 and 220 are executed again, that is, continue to receive the bit error rate information of the receive end and determine whether the bit error rate information meets the predetermined condition. If it is determined that the bit error rate information does not meet the predetermined condition, execute step 230.

230. If the bit error rate information of the receive end does not meet the predetermined condition, the transmit end adjusts the transmit power class value of the PHY chip at the transmit end.

Specifically, if it is determined that the bit error rate information does not meet the predetermined condition, the transmit power class value of the PHY chip at the transmit end is adjusted. The transmit power class value of the PHY chip at the transmit end may be specifically adjusted in a predetermined adjustment manner. In the embodiment of the present application, in this step, if the bit error rate information of the receive end does not meet the predetermined condition, the transmit power class value of the PHY chip at the transmit end is generally increased, that is, transmit power of the PHY chip at the transmit end is increased. For example, in 10GBASE-T, a transmit power class value of a PHY chip at a current transmit end is 2. If it is determined that bit error rate information does not meet a predetermined condition, the transmit power class value of the PHY chip at the transmit end can be adjusted from 2 to 3.

240. The transmit end obtains a signal-to-noise ratio of the transmit end and the signal-to-noise ratio of the receive end.

Specifically, the transmit end may obtain a current signal-to-noise ratio of the transmit end and may also obtain a current signal-to-noise ratio of the receive end in a manner similar to that of receiving the signal-to-noise ratio that is based on channel encoding and sent by the receive end in step 210. According to whether the current signal-to-noise ratio of the transmit end and the current signal-to-noise ratio of the receive end decrease, it is determined whether adjusting the transmit power class value of the PHY chip at the transmit end in step 230 successfully improves interference immunity of the link and reduces a bit error rate and packet loss of the link.

250. The transmit end determines whether the signal-to-noise ratio of the transmit end or the signal-to-noise ratio of the receive end decreases compared with that before step 230.

If the signal-to-noise ratio of the transmit end decreases compared with the signal-to-noise ratio of the transmit end before step 230, or the signal-to-noise ratio of the receive end decreases compared with the signal-to-noise ratio of the receive end before step 230, execute step 260; otherwise, execute step 270.

260. If the signal-to-noise ratio of the transmit end decreases compared with the signal-to-noise ratio of the transmit end before step 230, or the signal-to-noise ratio of the receive end decreases compared with the signal-to-noise ratio of the receive end before step 230, reversely adjust the transmit power class value of the PHY chip at the transmit end.

Specifically, after step 230 is executed, if either the signal-to-noise ratio of the transmit end of the link or the signal-to-noise ratio of the receive end of the link decreases compared with that before step 230, it is determined that adjustment in step 230 fails; then, execute this step, that is, reversely adjusting the transmit power class value of the PHY chip at the transmit end, to improve interference immunity of the link and ensure stable and reliable operating of the link. The reverse adjustment indicates adjusting the transmit power class value of the PHY chip at the transmit end in a direction opposite to the adjusting direction in step 230. If the transmit power class value of the PHY chip at the transmit end is increased in step 230, the reverse adjustment in this step indicates decreasing the transmit power class value of the PHY chip at the transmit end, that is, lowering the transmit power of the PHY chip at the transmit end. If the transmit power class value of the PHY chip at the transmit end is decreased in step 230, the reverse adjustment in this step indicates increasing the transmit power class value of the PHY chip at the transmit end, that is, raising the transmit power of the PHY chip at the transmit end. For example, in 10GBASE-T, a transmission distance range is 0-100 meters, the transmit power class value of the PHY chip at the transmit end is 2, and the signal-to-noise ratio of the transmit end or the signal-to-noise ratio of the receive end is 24 dB. Because it is detected that the bit error rate does not meet the predetermined condition, the transmit power class value of the PHY chip at the transmit end is adjusted from 2 to 3. If it is detected that the signal-to-noise ratio of the transmit end or the signal-to-noise ratio of the receive end after adjustment becomes 22 dB, that is, the signal-to-noise ratio decreases, the transmit power class value of the PHY chip at the transmit end is reversely adjusted from 3 to 1.

It should be noted that, after the transmit power class value of the PHY chip at the transmit end is reversely adjusted in this step, steps 240 and 250 may be executed, that is, continue to receive the signal-to-noise ratio and determine whether the signal-to-noise ratio of the receive end meets the predetermined condition, to determine whether the transmit power class value of the PHY chip at the transmit end needs to be adjusted again. If it is determined that the signal-to-noise ratio of the receive end meets the predetermined condition, it indicates that the current adjustment is successful, and the transmit end may execute step 210, that is, continue to execute the power control method in the embodiment.

270. If the signal-to-noise ratio of the transmit end keeps unchanged or increases compared with the signal-to-noise ratio of the transmit end before step 230, and the signal-to-noise ratio of the receive end keeps unchanged or increases compared with the signal-to-noise ratio of the receive end before step 230, it indicates that the power class value of the PHY chip at the transmit end is successfully adjusted. The transmit end may execute step 210, that is, continue to execute the power control method in the embodiment.

It should be noted that, step 250 may have multiple implementation manners. For example, the signal-to-noise ratio of the transmit end may be first detected to determine whether the signal-to-noise ratio of the transmit end decreases; if the signal-to-noise ratio of the transmit end decreases, the signal-to-noise ratio of the receive end does not need to be detected; if the signal-to-noise ratio of the transmit end keeps unchanged or increases, the signal-to-noise ratio of the receive end is detected and it is determined whether the signal-to-noise ratio of the receive end decreases; if the signal-to-noise ratio of the receive end keeps unchanged or increases, it can be determined that adjustment in step 230 is successful, and step 210 is executed, that is, continue to detect the bit error rate of the receive end.

The following describes in detail a process during which the transmit end receives the bit error rate information and/or the signal-to-noise ratio that is based on LDPC encoding and sent by the receive end.

Figure 3:
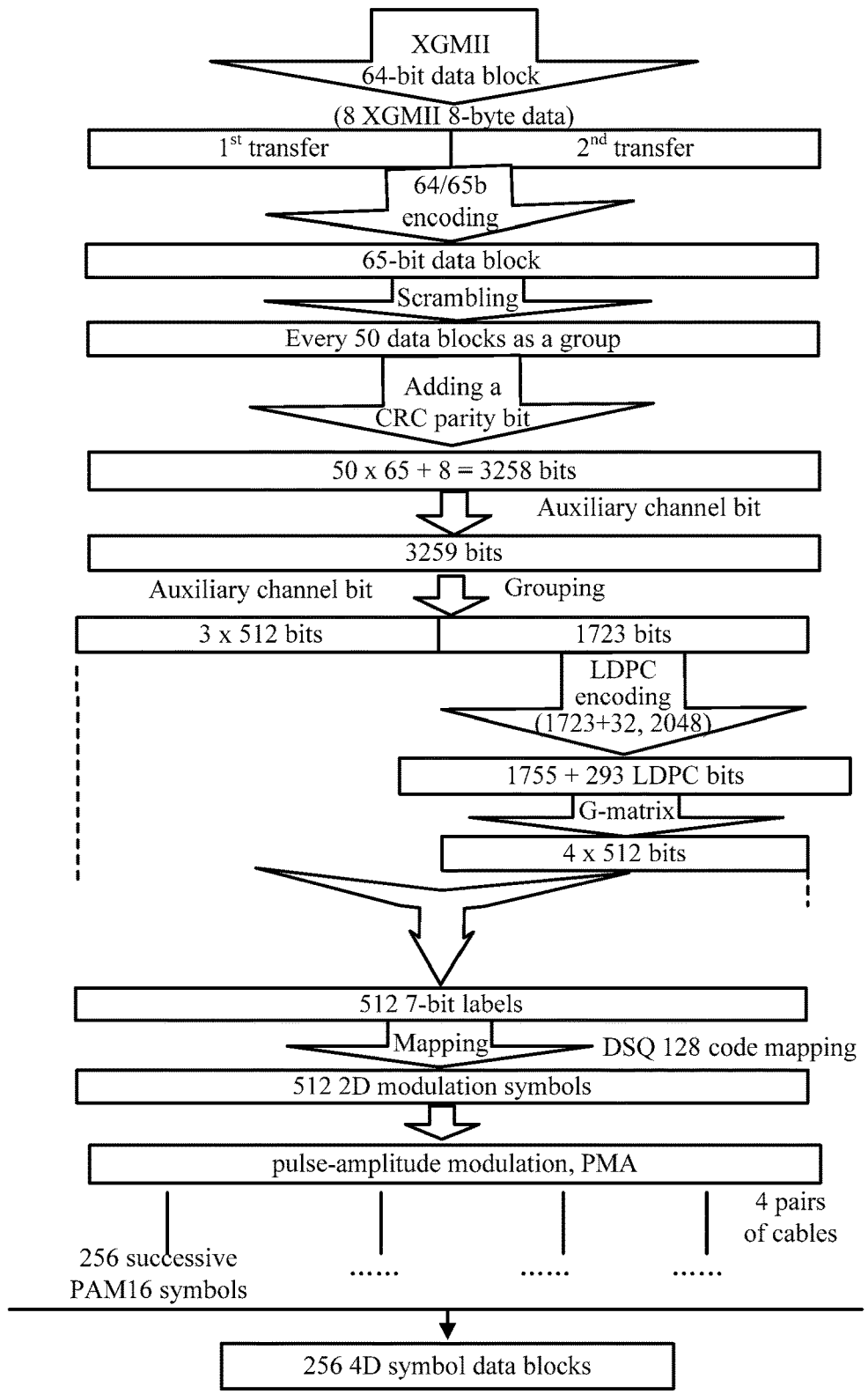
FIG. 3 is a schematic diagram of LDPC-encoding-based information transmission in a power control method according to an embodiment of the present application.

Specifically, as shown in FIG. 3, a PCS (Physical Coding Sublayer) of the PHY chip at the receive end receives an 8-byte data from an XGMII (10 Gigabit Medium Independent Interface), and divides the 8-byte data into 64-bit data blocks for 64B/65B encoding, in order to obtain 65-bit data blocks. Then scrambling is performed for each 65-bit data clock. Every 50 65-bit data blocks are used as a group, and an 8-bit CRC (cyclic redundancy check) parity bit is added to the group. As a result, a valid payload of 50×65+8=3258 bits is obtained. Then, an auxiliary channel bit is added to the valid payload to obtain a payload block of 3259 bits. After that, the 3259 bits are divided into two groups: 3×512 bits (including the auxiliary channel bit) and 1723 bits. Then, LDPC encoding is performed on the 1723 bits to form an LDPC (1723, 2048) code. In this embodiment, the number of bits of the LDPC code is modified, that is, 32-bit data is added to the 1723 bits of the LDPC (1723, 2048) code, to obtain 1755 bits and generate an LDPC (1755, 2048) code. In the 32-bit data, 16 bits are used to transmit the bit error rate information and the other 16 bits are used to transmit the signal-to-noise ratio. Then, (1755+293) LDPC bits are changed to 4×512 bits by using a G-matrix to form 2048 bits. Finally, 3×512 bits and 4×512 bits are combined to a data block of 7×512 bits, and then are arranged to form 512 7-bit labels, which is called line encoding of 10GBASE-T. So far, each 7-bit label includes 3 unencoded bits and 4 LDPC encoding bits. Finally, the 512 7-bit labels are mapped to 512 2D (two-dimensional) symbols selected by DSQ (Double Square QAM) 128, become 256 successive PAM16 symbols after pulse-amplitude modulation (PAM) performed by a PMA (Physical Medium Attachment Sublayer), and then are transmitted to the PHY chip at the transmit end through 10GBASE-T baseband transmission by using 4 pairs of cables.

According to the power control method of the foregoing embodiment of the present application, a transmit end of a link receives bit error rate information and/or a signal-to-noise ratio that is based on channel encoding and sent by a receive end of the link, so that valid bandwidth of the link is not occupied. The transmit end can adjust a transmit power class value of a PHY chip at the transmit end according to the bit error rate information of the receive end, to improve interference immunity of the link as well as stability and reliability of the link, thereby implementing stable and reliable data transmission.

Figure 4:
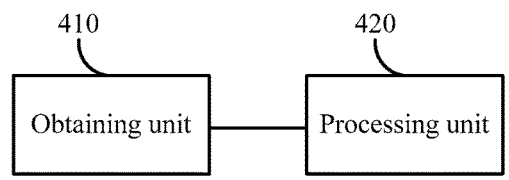
FIG. 4 is a structural block diagram of a power control apparatus according to an embodiment of the present application.

FIG. 4 shows a structural block diagram of a power control apparatus provided in an embodiment of the present application. As shown in FIG. 4, the power control apparatus includes an obtaining unit 410 and a processing unit 420, where the obtaining unit 410 is mainly configured to obtain bit error rate information of a receive end of a link, and the processing unit 420 is connected to the obtaining unit 410 and is mainly configured to adjust a transmit power class value of a transmit end of the link if the bit error rate information does not meet a predetermined condition.

For the foregoing power control apparatus, in a possible implementation manner, the obtaining unit 410 is further configured to obtain a signal-to-noise ratio of the transmit end and a signal-to-noise ratio of the receive end after the transmit power class value of the transmit end is adjusted. The processing unit 420 is further configured to reversely adjust the transmit power class value of the transmit end if the signal-to-noise ratio of the transmit end or the signal-to-noise ratio of the receive end decreases compared with that before the transmit power class value of the transmit end is adjusted.

For the foregoing power control apparatus, in a possible implementation manner, the obtaining unit 410 is further configured to receive the bit error rate information that is based on channel encoding and sent by the receive end, and receive the signal-to-noise ratio that is based on channel encoding and sent by the receive end.

For the specific mechanism of the obtaining unit 410 obtaining the bit error rate information of the receive end and/or the signal-to-noise ratios of the receive end and the transmit end, and the specific mechanism of the processing unit 420 adjusting and/or reversely adjusting the transmit power class value of the transmit end, refer to FIG. 1 to FIG. 3 of the present application and related description.

It should be noted that the power control apparatus may be located at the transmit end, or may be a separate apparatus independent of the receive end and the transmit end.

According to the obtained bit error rate information and/or signal-to-noise ratio, the transmit power class value of the PHY chip at the transmit end of the link is adjusted. According to the power control apparatus provided in the foregoing embodiment of the present application, the transmit power class value of the transmit end of the link can be dynamically adjusted according to a change of a system and an external environment, thereby improving interference immunity of the link and ensuring stable and reliable data transmission.

Figure 5:
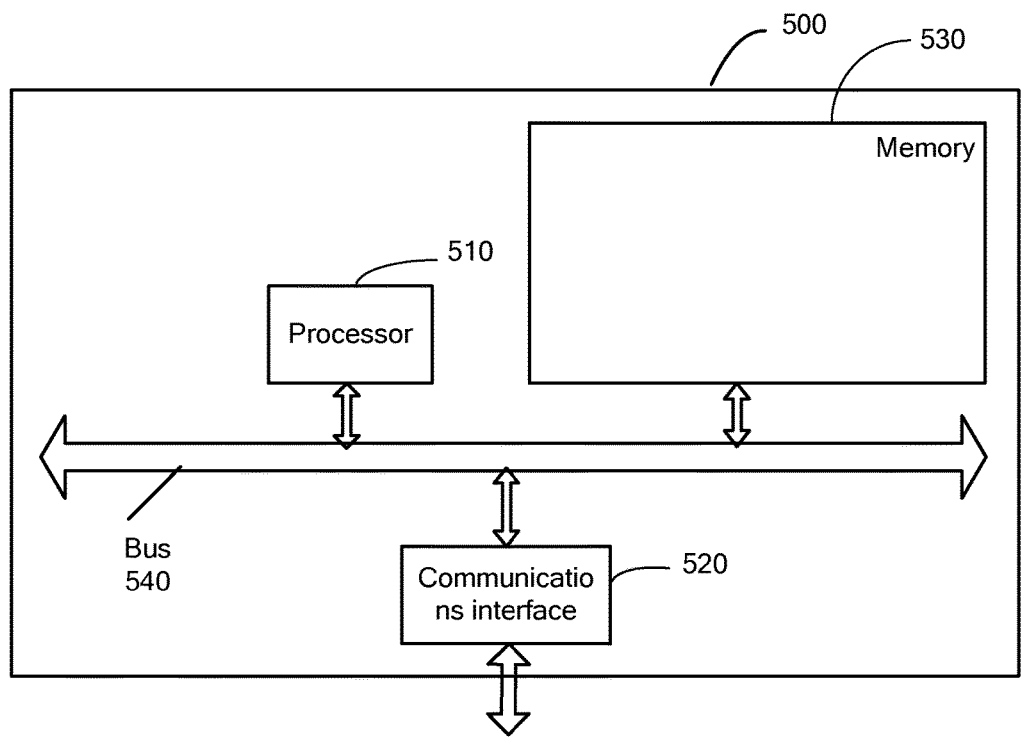
FIG. 5 is a structural block diagram of another power control apparatus according to an embodiment of the present application.

FIG. 5 shows a schematic diagram of a hardware structure of a power control apparatus provided in an embodiment of the present application.

The power control apparatus 500 includes a processor 510, a communication interface 520, a memory 530, and a bus 540, where the processor 510, the communication interface 520, and the memory 530 communicate with each other through the bus 540.

The communications interface 520 is configured to communicate with a receive end of a link. The link connects the communications interface 520 of the power control apparatus 500 to the receive end.

The processor 510 is configured to execute a program. The processor 510 may be a central processing unit CPU or an application specific integrated circuit ASIC (Application Specific Integrated Circuit), or be configured as one or more integrated circuits that implement the embodiment of the present application.

The memory 530 is configured to store a program. Specifically, the program may include program code, where the program code includes a computer operation instruction. The memory 530 may include a high speed RAM memory, and may also include a non-volatile memory, for example, at least one magnetic disk memory. The memory 530 may also be a memory array. The memory 530 may also be divided into different blocks, and the blocks may form a virtual volume according to a specific rule.

The processor 510 executes the program stored in the memory 530 to implement a power control method provided in an embodiment of the present application, where the method includes: obtaining, by a transmit end of the link, bit error rate information of the receive end; and if the bit error rate information does not meet a predetermined condition, adjusting a transmit power class value of the transmit end.

The method further includes: obtaining, by using the communications interface 520, a signal-to-noise ratio of the transmit end and a signal-to-noise ratio of the receive end after the transmit power class value of the transmit end is adjusted; if the signal-to-noise ratio of the transmit end and the signal-to-noise ratio of the receive end remain unchanged or increase compared with those before the transmit power class value of the transmit end is adjusted, determining that power control is successful; if the signal-to-noise ratio of the transmit end or the signal-to-noise ratio of the receive end decreases compared with that before the transmit power class value of the transmit end is adjusted, reversely adjusting the transmit power class value of the transmit end.

The method further includes: receiving, by using the communications interface 520, the bit error rate information and the signal-to-noise ratio that are based on channel encoding and sent by the receive end.

The power control apparatus 500 is configured to detect a specific mechanism of the bit error rate information of the receive end and/or the signal-to-noise ratios of the receive end and the transmit end, and is configured to adjust and/or reversely adjust a specific mechanism of the transmit power class value of a PHY chip at the transmit end, for which, reference may be made to FIG. 1 to FIG. 3 of the present application and related description.

By using the detected bit error rate information and/or signal-to-noise ratio, the transmit power class value of the PHY chip at the transmit end of the link is adjusted in real time. According to the power control apparatus provided in the foregoing embodiment of the present application, the transmit power class value of the transmit end of the link can be dynamically adjusted according to a change of a system and an external environment, thereby improving interference immunity of the link and ensuring stable and reliable data transmission.

A person of ordinary skill in the art may be aware that, units and algorithm steps of each example described in the embodiments in this specification can be implemented by electronic hardware, or a combination of computer software and electronic hardware. Whether the functions are implemented in a form of hardware or software depends on particular applications and design constraint conditions of the technical solutions. A person skilled in the art may use different methods to implement the described functions for each particular application, but it should not be considered that the implementation goes beyond the scope of the present application.

If the functions are implemented in a form of computer software and sold or used as an independent product, it can be considered to some extent that all or a part (for example, the part contributing to the prior art) of the technical solutions of the present application may be embodied in a form of a computer software product. The computer software product is generally stored in a computer readable storage medium, and includes several instructions for instructing a computer device (which may be a personal computer, a server, a network device, or the like) to execute all or part of the steps of the methods in the embodiments of the present application. The foregoing storage medium includes: any medium that can store a program code, such as a USB flash drive, a removable hard disk, a read-only memory (Read-Only Memory, ROM), a random access memory (Random Access Memory, RAM), a magnetic disk, or an optical disc.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claim.

What is claimed is:

1. A power control method in a transmission link, the method comprising:
   obtaining, by a power control apparatus at a transmit end of a transmission link, first performance information received from a receive end of the transmission link;
   adjusting, by the power control apparatus, a transmit power class value of the transmit end when the first performance information does not meet a predetermined condition;
   repeatedly
   (i) obtaining, by the power control apparatus, signal-to-noise information after adjusting the transmit power class value, and
   (ii) adjusting, by the power control apparatus, the transmit power class value of the transmit end when a signal-to-noise ratio at the transmit end decreases;
   responding, by the power control apparatus, to changing signal-to-noise information at the receive end only after the signal-to-noise ratio obtained at the transmit end no longer decreases;
   ending, by the power control apparatus, adjustments of the transmit power class value in response to changes to the signal-to-noise information at the receive end when the changes meet a predetermined condition;

obtaining additional performance information at the receive end when the signal-to-noise ratio of the signal-to-noise information at the transmit end remains the same or increases compared with the first performance information at the receive end before the adjustment of transmit power class value;

determining that power control is successful when the additional performance information at the receive end remains unchanged or increases compared with the first performance information at the receive end before the adjustment of the transmit power class value; and reversely adjusting the transmit power class value of the transmit end when the additional performance information at the receive end decreases compared with the first performance information obtained before the adjustment of the transmit power class value.

2. The power control method according to claim 1, wherein the transmit end receives the first performance and signal-to-noise information, where the information is based on channel encoding sent by the receive end.

3. The power control method according to claim 2, wherein:

the channel encoding is low-density parity-check (LDPC) encoding when the link is an Ethernet link in a 10 Gigabit Ethernet over twisted pair copper cable; and wherein the bit error rate information and the signal-to-noise ratio are obtained as follows:

a) an 8-byte data is divided into 64-bit data blocks;
b) 64B/65B encoding is performed for the 64-bit data blocks to obtain 65-bit data blocks;
c) every fifty 65-bit data blocks identify a group and a 8-bit cyclic redundancy check (CRC) parity bit is added to each group to obtain a valid payload of (50×65-bit+8-bit)=3258 bits;
d) an auxiliary channel bit is added to each valid payload to obtain a payload block of 3259 bits;
e) the 3259 bits of each payload block are divided into a first group of 3×512 bits, including the auxiliary channel bit, and a second group of 1723 bits;
f) 32-bit data is added to the second group in order to obtain 1755 bits, wherein 16 bits in the 32-bit data are used to transmit the bit error rate information, the other 16 bits in the 32-bit data are used to transmit the signal-to-noise ratio;
g) the second group performs LDPC (1755, 2048) coding to 4×512 bits, and the first and second groups are combined to a data block of 7×512 bits;
h) the data block is arranged to form 512 7-bit labels, wherein each 7-bit label includes 3 unencoded bits and 4 LDPC coded bits; and
i) the 512 7-bit labels are processed to signals for 10GBASE-T baseband transmission.

4. The power control method according to claim 1, wherein the first performance information comprises a bit error rate of the receive end.

5. The power control method according to claim 1, wherein the first performance information comprises a bit error rate of the receive end and bit error duration of the receive end.

6. The power control method according to claim 1, wherein the first performance information comprises a bit error rate of the receive end and a number of data packet retransmission times of the receive end.

7. The power control method according to claim 1, wherein the first performance information comprises a bit error rate of the receive end, bit error duration of the receive end, and a number of data packet retransmission times of the receive end.

8. A power control apparatus comprising:
a processing hardware platform; and
a non-transitory computer-readable storage medium storing instructions for execution by the processing hardware platform so as to configure the platform to:
obtain, at a transmit end of a transmission link, first performance information received from a receive end of the transmission link;
adjust a transmit power class value of the transmit end of the transmission link when the first performance information does not meet a predetermined condition;
repeatedly
(i) obtaining signal-to-noise information after adjusting the transmit power class value, and
(ii) adjusting the transmit power class value of the transmit end when a signal-to-noise ratio at the transmit end decreases;
responding to changing signal-to-noise information at the receive end only after the signal-to-noise ratio obtained at the transmit end no longer decreases;
ending adjustments of the transmit power class value in response to changes to the signal-to-noise information at the receive end when the changes meet a predetermined condition;
obtain additional performance information at the receive end after the transmit power class value of the transmit end is adjusted when the signal-to-noise ratio of the signal-to-noise information at the transmit end remains the same or increases compared with the first performance information at the receive end before the adjustment of transmit power class value; and
reversely adjust the transmit power class value of the transmit end when the additional performance information at the receive end decreases compared with the first performance information obtained before the adjustment of the transmit power class value.

9. The power control apparatus according to claim 8, wherein processing the hardware platform is further configured to:
receive the first performance information that is based on channel encoding and sent by the receive end, and
receive the signal-to-noise information that is based on channel encoding and sent by the receive end.

10. The power control apparatus according to claim 8, wherein the first performance information comprises a bit error rate of the receive end.

11. The power control apparatus according to claim 8, wherein the first performance information comprises a bit error rate of the receive end and bit error duration of the receive end.

12. The power control apparatus according to claim 8, wherein the first performance information comprises a bit error rate of the receive end and the number of data packet retransmission times of the receive end.

13. The power control apparatus according to claim 8, wherein the first performance information comprises a bit error rate of the receive end, bit error duration of the receive end, and the number of data packet retransmission times of the receive end.

14. A power control apparatus for controlling transmit power of a transmit end of a link comprising:

a processor;
a communication interface configured to communicate with a receive end of the link; and
a non-transitory, processor-readable memory connected with the processor and communication interface through a bus;
the processor executes a program stored in the memory so as to configure the processor to:
  obtain first performance information of the receive end;
  adjust a transmit power class value of the transmit end to control the transmission of power when the first performance information does not meet a predetermined condition;
  repeatedly (i) obtaining signal-to-noise information after adjusting the transmit power class value; and (ii) adjusting the transmit power class value of the transmit end when a signal-to-noise ratio at the transmit end decreases;
  responding to changing signal-to-noise information at the receive end only after the signal-to-noise ratio obtained at the transmit end no longer decreases;
  ending adjustments of the transmit power class value in response to changes to the signal-to-noise information at the receive end when the changes meet a predetermined condition;
  obtain additional performance information at the receive end when the signal-to-noise ratio of the signal to noise information at the transmit end remains the same or increases compared with the first performance information at the receive end before the adjustment of transmit power class value; and
  determine that power control is successful when the additional performance information at the receive end remains unchanged or increases compared with the first performance information at the receive end before the adjustment of the transmit power class value; and reversely adjust the transmit power class value of the transmit end when the additional performance information at the receive end decreases compared with the first performance information obtained before the adjustment of the transmit power class value.

15. The power control apparatus according to claim 14, wherein the additional performance information is a signal-to-noise ratio and the transmit end receives the first and additional performance information, which is based on channel encoding sent by the receive end.

16. The power control apparatus according to claim 15, wherein the channel encoding is low-density parity-check (LDPC) encoding when the link is an Ethernet link in a 10 Gigabit Ethernet over twisted pair copper cable;
  the channel encoding is 64B/66B encoding when the link is an optical link in an optical communications network; and
  the channel encoding is orthogonal frequency division multiplexing encoding when the link is a radio link in a wireless local area network.

17. The power control apparatus according to claim 14, wherein the first performance information comprises a bit error rate of the receive end.

18. The power control apparatus according to claim 14, wherein the first performance information comprises a bit error rate of the receive end and bit error duration of the receive end.

19. The power control apparatus according to claim 14, wherein the first performance information comprises a bit error rate of the receive end and the number of data packet retransmission times of the receive end.

20. The power control apparatus according to claim 14, wherein the first performance information comprises a bit error rate of the receive end, bit error duration of the receive end, and the number of data packet retransmission times of the receive end.

* * * * *